United States Patent [19]

Malhi et al.

[11] Patent Number: 5,182,222

[45] Date of Patent: Jan. 26, 1993

[54] PROCESS FOR MANUFACTURING A DMOS TRANSISTOR

[75] Inventors: Satwinder Malhi, Garland; Taylor R. Efland, Richardson, both of Tex.

[73] Assignee: Texas Instruments Incorporated, Dallas, Tex.

[21] Appl. No.: 720,570

[22] Filed: Jun. 26, 1991

[51] Int. Cl.$^5$ .......................................... H01L 21/265
[52] U.S. Cl. ........................................ 437/41; 437/44; 437/58; 437/200; 437/913; 148/DIG. 126
[58] Field of Search .................. 437/41, 984, 29, 40, 437/913, 44, 58; 148/DIG. 126

[56] References Cited

U.S. PATENT DOCUMENTS

| | | | |
|---|---|---|---|
| 4,319,932 | 3/1982 | Jambotkar | 437/984 |
| 4,757,032 | 7/1988 | Contiero | 437/41 |
| 4,798,810 | 1/1989 | Blanchard et al. | 437/41 |
| 4,810,665 | 3/1989 | Chang et al. | 437/41 |
| 4,853,345 | 8/1989 | Himelick | |
| 4,879,254 | 11/1989 | Tsuzuki et al. | |
| 4,883,767 | 11/1989 | Gray et al. | 437/41 |
| 4,960,723 | 10/1990 | Davies | 437/41 |
| 4,970,173 | 11/1990 | Robb | 437/41 |
| 5,028,554 | 7/1991 | Kita | 437/41 |
| 5,032,532 | 7/1991 | Mori et al. | 437/41 |
| 5,034,336 | 7/1991 | Seki | 437/41 |
| 5,041,394 | 8/1991 | Spratt et al. | 437/200 |

FOREIGN PATENT DOCUMENTS 0244366 11/1987 European Pat. Off. ............. 437/41

*Primary Examiner*—Brian E. Hearn
*Assistant Examiner*—Michael Trinh
*Attorney, Agent, or Firm*—Ira S. Matsil; James C. Kesterson; Richard L. Donaldson

[57] ABSTRACT

A method is provided for manufacturing a semiconductor device at a face of a semiconductor layer having a first conductivity type. Over the semiconductor layer and insulating therefrom a gate conductive layer is formed, which has a predetermined pattern defining an opening. A well of a second conductivity type is then implanted into the face of the semiconductor layer by self-aligning to the sidewall of the gate conductive layer. A first surface region of the first conductivity type is formed within the well and self-aligned to the sidewall of the gate conductive layer. A sacrificial sidewall layer is formed in the opening which defines a second narrower opening, so that a subsurface region of the second conductivity type may be formed within the well self-aligned to the sacrificial sidewall layer. A second surface region of the second conductivity type is then formed substantially within the first surface region and self-aligned to the sacrificial sidewall layer. The construct of the first and second surface regions is such that the second surface region at the face of the semiconductor layer is substantially surrounded by the first surface region. The sacrificial sidewall layer is removed and a thinner insulating sidewall is formed in the opening. In this manner, the second surface region as well as a portion of the first surface region substantially surrounding the first surface region are exposed. Subsequently, a source electrode contacting the exposed second surface region and the exposed first surface region substantially surrounding the second surface region at the face of said semiconductor layer is formed.

11 Claims, 1 Drawing Sheet

PROCESS FOR MANUFACTURING A DMOS TRANSISTOR

TECHNICAL FIELD OF THE INVENTION

This invention relates in general to the field of semiconductor devices. More particularly, the present invention relates to the manufacture of a MOS (metal-oxide semiconductor) device of the type known as a DMOS (double diffused MOS) transistor.

BACKGROUND OF THE INVENTION

DMOS transistors, particularly of the vertical type, are important in power device applications capable of handling high voltages. For such devices, the figure of merit is the current handling capability per unit area or the ON resistance per unit area. For a given voltage rating, the ON resistance per unit area may be reduced by reducing the cell area of the DMOS device.

In the field of power transistors, the combined width of the polycrystalline silicon (polysilicon) and the contact region, which forms the gate and source electrodes, respectively, is defined as the cell pitch of the device. For a DMOS power transistor, a known technique to reduce the width of the polysilicon region is by decreasing the P-well junction depth. However, minimum junction depth is dictated by the breakdown voltage required. Therefore, further cell size reduction must come from reducing the size of the contact area of the device.

Therefore, a need has arisen for reducing the contact area of a vertical DMOS device to further minimize the overall cell pitch of the device, which in turn enhances its current handling per unit area capabilities. The present invention provides a DMOS transistor and a new semiconductor manufacturing process which enable a reduction of the contact area of the DMOS device so that its ON resistance per unit area is decreased.

SUMMARY OF THE INVENTION

In accordance with the present invention, a DMOS and method for manufacturing thereof are provided which overcome disadvantages of prior such devices and manufacturing processes.

In one aspect of the present invention, a method is provided for manufacturing a semiconductor device at a face of a semiconductor layer having a first conductivity type. Over the semiconductor layer and insulating therefrom a gate conductive layer is formed, which has a predetermined pattern defining an opening. A well of a second conductivity type is then implanted into the face of the semiconductor layer by self-aligning to the sidewall of the gate conductive layer. A first surface region of the first conductivity type is formed within the well and self-aligned to the sidewall of the gate conductive layer.

Thereafter, a sacrificial sidewall layer is formed in the opening which defines a second narrower opening, so that a subsurface region of the second conductivity type may be formed within the well and self-aligned to the sacrificial sidewall layer. A second surface region of the second conductivity type is then formed substantially within the first surface region and self-aligned to the sacrificial sidewall layer and hence self-aligned to the gate conductive area also. The construct of the first and second surface regions is such that the second surface region at the face of the semiconductor layer is substantially surrounded by the first surface region.

The sacrificial sidewall layer is removed and a thinner insulating sidewall is formed in the opening. In this manner, the second surface region as well as a portion of the first surface region substantially surrounding the second surface region are exposed. Subsequently, a source electrode contacting the exposed second surface region and the exposed first surface region substantially surrounding the second surface region at the face of said semiconductor layer is formed.

In another aspect of the present invention, a vertical DMOS device formed on a face of a semiconductor layer of a first conductivity type is provided. The DMOS transistor comprises a gate conductive layer formed on the face of the semiconductor layer and insulated therefrom, where the gate conductive layer defines an opening. A tank of a second conductivity type is formed in the semiconductor layer under the opening, and a first surface region of the first conductivity type is formed and contained within the tank. A second surface region of the first conductivity type is formed and contained within the tank and has a width substantially less than that of the first surface region and a depth substantially more than that of the first surface region. To view the face of the semiconductor layer from the top, the first surface region substantially surrounds the second surface region at the surface of the semiconductor layer.

An insulating sidewall layer formed over the opening sidewall exposes both the second surface region and the surrounding first surface region at the face of the semiconductor layer. A highly conductive layer overlies the exposed first and second surface regions, and is connected to a source electrode. A drain electrode is further provided at an opposed face of the semiconductor wafer.

An important technical advantage of the present invention is enhancing the resistivity per unit area of the resulting DMOS device so that its current handling capacity is increased.

A further technical advantage of the present invention provides for a more compact DMOS transistor having a smaller cell pitch and a manufacturing method therefor.

BRIEF DESCRIPTION OF THE DRAWINGS

For a better understanding of the present invention, reference may be made to the accompanying drawings, in which.

DETAILED DESCRIPTION OF THE INVENTION

Figure 1:
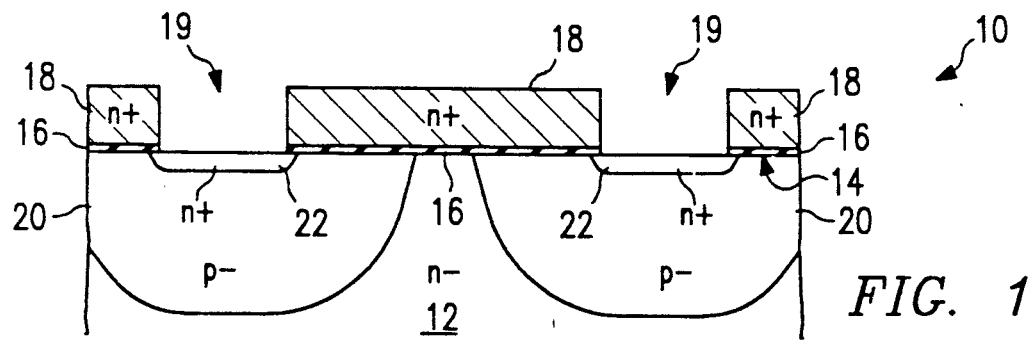
FIGS. 1 through 4 are cross section views of a silicon wafer in various stages of manufacture in accordance with the preferred embodiment of the present invention.

With reference to the drawings, FIG. 1 illustrates a silicon wafer 10 whose bulk is of n+ conductivity (not shown) upon which an n− epitaxial region 12 is grown by an epitaxial growth process. Specifically, epitaxial region 12 is grown on wafer 10 with a top surface 14. For a desired breakdown voltage of 60 volts, for example, epitaxial region 12 may have a doping density in the range of $5 \times 10^{15}/cm^3$ to $1 \times 10^{16}/cm^3$. The doping density of epitaxial region 12 may be lowered if a higher breakdown voltage is desired, and vice versa, as known in the art.

Subsequently, a gate oxide layer 16 consisting of SiO$_2$ having a thickness of approximately 500 Å, for example, is formed on top of epitaxial region 12. Gate oxide 16 may be formed by oxidizing surface 14 of epitaxial region 12 by subjecting surface 14 to dry oxygen at a temperature of 900° C.

A layer 18 of polycrystalline silicon (polysilicon) is then deposited on top of gate oxide 16 forming the gate. Polysilicon layer 18 is preferably 0.5 μm thick and doped n+ type by using phosphorus as a dopant. Polysilicon layer 18 may be formed by a chemical vapor deposition (CVD) method as known in the art.

Thereafter, gate oxide and polysilicon layers 16 and 18 are etched to make an opening 19 with a gate mask (not shown) having a desired pattern. For the purpose of illustration, the manufacturing steps for two individual DMOS cells are shown in FIGS. 1-4, where identical reference numerals are used to designate identical features of both cells.

A p− type D-well region 20 is then formed under opening 19 by implantation and diffusion steps. Doping impurities such as boron may be used in a self-aligned ion implantation process. An exemplary dosage of boron may be $1 \times 10^{13}/cm^2$. Diffusion is then performed by subjecting wafer 10 to, for example, 1100° C. temperature for 500 minutes in an ambient of nitrogen.

After having formed D-well region 20, an n+ type diffused region 22 is formed in D-well 20 by ion implantation of arsenic at a dose of, for example, $1 \times 10^{15}/cm^2$. The diffusion of region 22 is then formed by an annealing process where it is subjected to, for example, a temperature of 900° C. for two hours in an ambient of nitrogen.

Figure 2:
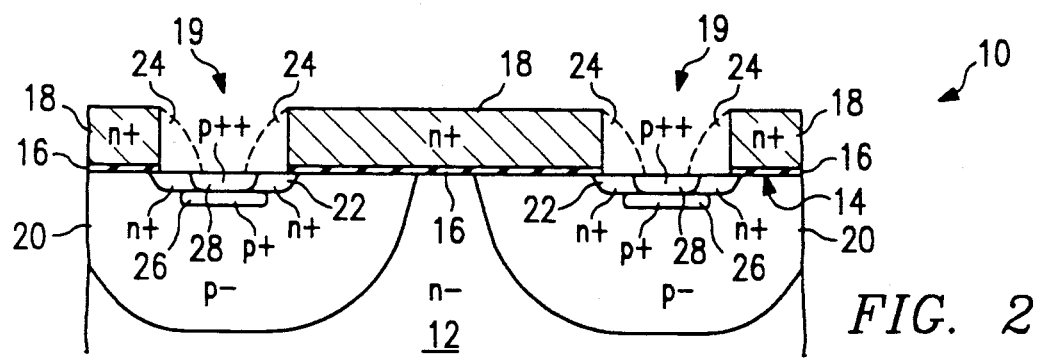

Referring to FIG. 2, a nitride sacrificial sidewall 24 is created in opening 19. The thickness of sacrificial sidewall 24 at the bottom surface where it contacts diffused region 22 is approximately the same as the height of polysilicon 18 due to the nature of the conformal deposition and directional anisotropic etching processes in which sacrificial sidewall 24 is formed. Note that sacrificial sidewall 24 in effect narrowed opening 19.

Two distinct regions 26 and 28 are then formed in D-well 20 by implantation through opening 19 narrowed by sacrificial sidewall 24. Subsurface p+ type region 26 is formed by deep boron implantation at a dosage of, for example, $5 \times 10^{14}/cm^2$. As shown, subsurface region 26 lies substantially below diffused surface region 22. A p++ type region 28 is then formed by surface boron implantation at a higher dosage such as $5 \times 10^{15}/cm^2$. After implanting both regions 26 and 28, diffusion of both regions 26 and 28 is performed in an ambient of nitrogen at 900° C. for two hours. In effect, as viewed from the top, region 28 is created so that it is an island surrounded by region 22 at the surface of wafer 10. Sacrificial nitride sidewall 24 may then be removed by a wet etch process in which phosphoric acid at a temperature of 160° C. is used as the etchant for approximately 2 hours. Note that sacrificial sidewall may be formed from any other material that can be selectively removed without injuring the silicon, polysilicon and oxide features already present on wafer 10. Furthermore, it is contemplated that sacrificial sidewall 24 may be accomplished by a combination of multiple layers and etches.

Figure 3:
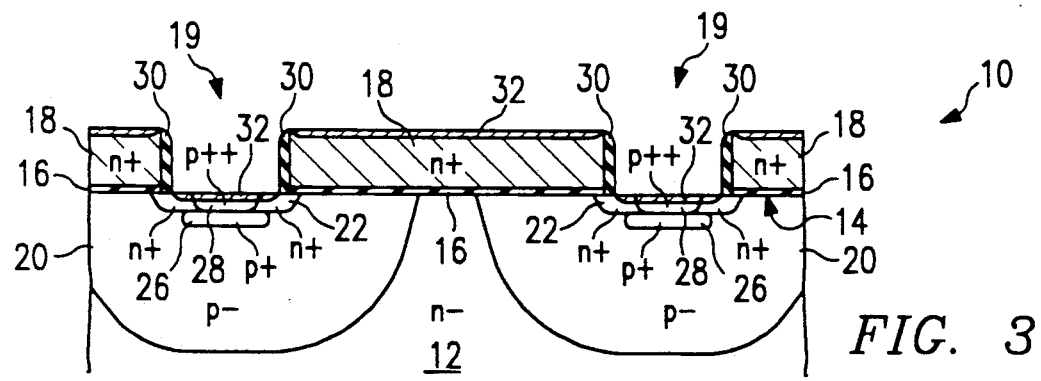

In FIG. 3, a thin oxide sidewall 30 is formed in opening 19. The thickness of oxide sidewall 30 must be such that the interface between n+ region 22 and p++ region 28 all the way around region 28 is still exposed to opening 19. Therefore oxide sidewall 30 may be 1000 Å, or 0.1 μm thick for this purpose.

Subsequently, a silicide layer 32 is formed on the exposed top surfaces of polysilicon layer 18 and regions 22 and 28 in opening 19. The formation of silicide layer 32 may be achieved by a four step self-aligned silicide process. A 1000 Å thick layer (not shown) of titanium is first deposited on wafer 10 covering all exposed surfaces. The titanium layer is then transformed to highly conductive titanium silicide wherever it contacts silicon or polysilicon by reacting the titanium with nitrogen at a temperature of, for example, 675° C. However, the titanium that is over oxide sidewall 30 is not converted by this process. A wet etch process is then performed with an etchant, such as hydrogen peroxide, to remove the titanium remaining on top of oxide sidewall 30. In this manner, silicide layer 32 having the construction shown in FIG. 3 is formed. Silicide layer 32 is formed atop gate polysilicon layer 18 and further on top of regions 22 and 28 in narrowed opening 19. Note that no matter which cross section of narrowed opening 19 and regions 2, 26 and 28 in D-well 20 is taken, silicide layer 32 makes contact with region 28 and also region 22 on both sides thereof. The above four steps illustrate a conventional SALICIDE process as known in the art.

Figure 4:
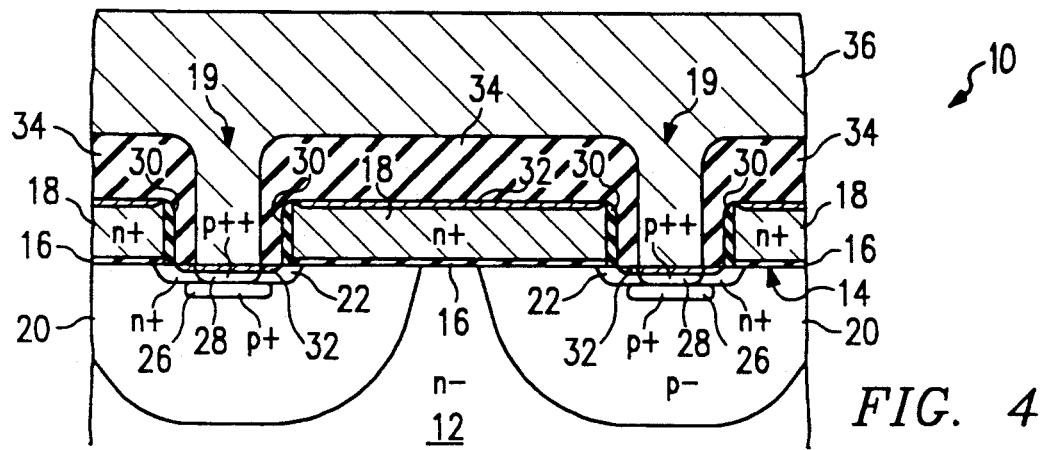

In FIG. 4, a layer of oxide 34 of approximately 1 μm thickness is deposited over the entire area of surface 14. Then a contact opening is formed in opening 19 by a mask process to expose silicide layer 32. A metal layer 36 is then deposited, which may consist of aluminum and 1% silicon of 1 μm thickness. Metal layer 36, as shown, directly contacts silicide layer 32 in the contact opening. Because silicide layer 32 contacts regions 22 and 28, the fear of metal misalignment in the contact opening is eliminated.

Not shown in the drawing figures are structures on th other side of wafer 10. A metal layer is formed on the opposed side of wafer 10 to provide a contact for the drain electrode (not shown) of the DMOS device. On first side 14 of wafer 10 the source electrode of the DMOS device is formed in metal layer 36 and the gate electrode of the device is formed in silicide layer 32.

Accordingly, a DMOS device constructed in the preferred embodiment of the present manufacturing process would have a cell pitch of approximately 7 μm as compared with 15-25 μm cell pitches of conventional DMOS devices constructed with conventional manufacturing processes. Because a smaller cell size directly translates to a reduction in the ON resistance per unit area, the DMOS device constructed in accordance with the present invention has more current handling capabilities per unit area than conventional devices.

It is therefore important to note from the foregoing that the instant manufacturing process allows the production of a DMOS device that is substantially smaller than conventional devices. This is made possible by the use of sacrificial sidewall 24 and thin oxide sidewall 30 that permit self-alignment with the polysilicon gate region. The resultant device is very symmetrical, a quality important to device performance. Furthermore, because of the use of silicide layer 32 to form the contact between metal layer 36 and the n-p-n region, formed by n+ type diffused region 22 and p++ type region 28, a very narrow contact window 19 is possible, which further contributes to a substantially smaller cell pitch.

Although the present invention has been described in detail, it should be understood that various changes, substitutions and alterations can be made thereto without departing from the spirit and scope of the present invention as defined by the appended claims. More specifically, it is important to note that the chemical compositions, concentrations and other detailed specifications enumerated above serve as illustrative examples and may be substituted by other such specifications as known in the art of semiconductor processing without departing from the present invention.

What is claimed is:

1. A method for manufacturing a semiconductor device at a face of a semiconductor layer having a first conductivity type, comprising the steps of:

forming over said semiconductor layer and insulating therefrom a gate conductive layer having a predetermined pattern defining an opening having a sidewall;

implanting a well of a second conductivity type into said face of said semiconductor layer and being substantially self-aligned to said sidewall of said gate conductive layer;

forming a first surface region of said first conductivity type substantially self-aligned to said sidewall of said gate conductive layer, said first surface region being substantially contained within said well;

forming a sacrificial sidewall layer having a predetermined thickness over said sidewall of said gate conductive layer, said sacrificial sidewall layer defining a second opening within said opening and having margins spaced away from margins of said opening;

forming a subsurface region of said second conductivity type within said well and substantially self-aligned to said sacrificial sidewall layer;

forming a second surface region of said second conductivity type substantially within said first surface region substantially self-aligned to said sacrificial sidewall layer, so that said second surface region at said face of said semiconductor layer is substantially surrounded by said first surface region;

removing said sacrificial sidewall layer;

forming an insulating sidewall over said sidewall of said gate conductive layer and having a predetermined thickness less than that of said removed sacrificial sidewall layer and exposing said second surface region as well as a portion of said first surface region substantially surrounding said second surface region; an providing a source electrode contacting said exposed second surface region and said exposed first surface region substantially surrounding said second surface region at said face of said semiconductor layer.

2. The method, as set forth in claim 1, wherein said source electrode providing step further comprises the steps of:

forming a highly conductive layer over said exposed second surface region as well as said exposed first surface region substantially surrounding said second surface region, said highly conductive layer being substantially self-aligned to said insulating sidewall;

forming an insulating layer over said face of said semiconductor layer and removing a portion thereof to expose a portion of said highly conductive layer over said first and second surface regions; and forming a source electrode electrically connected to said highly conductive layer.

3. The method, as set forth in claim 1, further comprising the step of forming a drain electrode on an opposed face of said semiconductor layer.

4. The method, as set forth in claim further comprising the step of forming a highly conductive layer directly over the face of said gate conductive layer prior to said insulating layer forming step.

5. A method for manufacturing a semiconductor device on a wafer, comprising the steps of:

forming a first layer of a first conductivity type on a main face of said wafer;

forming over said first layer and insulating therefrom a gate conductive layer having a predetermined pattern defining an opening having a sidewall;

forming a well of a second conductivity type in said main face of said first layer using said gate conductive layer as a mask;

forming a first surface region of said first conductivity type within said well using said gate conductive layer as a mask;

forming a sacrificial sidewall layer having a predetermined thickness over said sidewall of said gate conductive layer, said sacrificial sidewall layer substantially narrowing said opening in said gate conductive layer;

forming a subsurface region of said second conductivity type within said well being substantially self-aligned to said sacrificial sidewall layer;

forming a second surface region of a second conductivity type in said first surface region and having substantially higher conductivity than said subsurface region, said second surface region having a substantially narrower width than that of said first surface region and being completely surrounded by said first surface region at said face of said wafer;

removing said sacrificial sidewall layer;

forming an insulating sidewall over said sidewall of said gate conductive layer and having a predetermined thickness less than that of said removed sacrificial sidewall layer, so that said second surface region as well as said first surface region surrounding said second surface region are exposed; and forming a source electrode contacting said exposed first and second surface regions.

6. The method, as set forth in claim 5, wherein said source electrode forming step includes the steps of:

forming a first highly conductive layer over said exposed first and second surface regions and being substantially self-aligned to said insulating sidewall;

forming an insulating layer over said main face of said wafer and removing a portion thereof to expose a portion of said highly conductive layer over said first and second surface regions; and forming a second highly conductive layer over said main face of said wafer and contacting said exposed portion of said highly conductive layer.

7. The method, as set forth in claim 5, further comprising the step of forming an electrode on an opposed face of said wafer.

8. The method, as set forth in claim 6, wherein said highly conductive layer forming step further comprises the step of forming said highly conductive layer over said gate conductive layer.

9. A method for making a semiconductor device at a face of a semiconductor layer, comprising the steps of:

forming a gate over said semiconductor layer, said gate defining a through-opening to said semiconductor layer;

forming a first region of a first conductivity type substantially self-aligned with said through-opening;

after forming said gate, and prior to said step of forming said first region, implanting a deep well into said semiconductor layer through said through-opening;

forming a sacrificial sidewall in said through-opening subsequent to forming said first region;

forming a second region of a second conductivity type different than said first conductivity type substantially self-aligned with said sacrificial sidewall subsequent to forming said sacrificial sidewall;

prior to forming said second region of said second conductivity type, forming a third region of said second conductivity type below said first region substantially self-aligned with said sacrificial sidewall;

removing said sacrificial sidewall; and forming a high conductivity surface region in contact with both said first and second regions of said first and second conductivity type.

10. The method, as set forth in claim 9, wherein said high conductivity region forming step further comprises the steps of:

depositing an insulating layer over said gate and defining narrowed through-openings to said high conductivity surface region; and forming a high conductivity layer over said insulating layer and said high conductivity surface region.

11. The method, as set forth in claim 10, further comprising the step of narrowing said through-opening prior to forming said high conductivity surface region, so that said high conductivity surface region is substantially self-aligned with said narrowed through-opening.

* * * * *